United States Patent [19] [11] Patent Number: 5,317,213
Sato et al. [45] Date of Patent: May 31, 1994

[54] LEVEL CONVERTER WITH DELAY CIRCUITRY USED TO INCREASE SWITCHING SPEED

[75] Inventors: Hirotoshi Sato; Atsushi Ohba; Akira Hosogane, all of Hyogo, Japan

[73] Assignee: Mitsubishi Denki Kabushiki Kaisha, Tokyo, Japan

[21] Appl. No.: 961,979

[22] Filed: Oct. 16, 1992

[30] Foreign Application Priority Data

Nov. 21, 1991 [JP] Japan .................................. 3-306214

[51] Int. Cl.5 .............. H03K 19/0185; H03K 19/0948
[52] U.S. Cl. ..................................... 307/475; 307/451
[58] Field of Search ................ 307/443, 451, 475, 263

[56] References Cited

U.S. PATENT DOCUMENTS

| | | | |
|---|---|---|---|
| 4,318,015 | 3/1982 | Schade, Jr. | 307/475 |
| 4,450,371 | 5/1984 | Bismark | 307/475 |
| 4,656,374 | 4/1987 | Rapp | 307/475 |
| 4,845,381 | 7/1989 | Cuevas | 307/475 |
| 4,859,870 | 8/1989 | Wong et al. | 307/451 |
| 4,897,567 | 1/1990 | Bacrania | 307/451 |
| 4,980,583 | 12/1990 | Dietz | 307/475 |
| 5,039,886 | 8/1991 | Nakamura et al. | 307/475 |
| 5,075,581 | 12/1991 | Kamata | 307/475 |
| 5,151,622 | 9/1992 | Thrower et al. | 307/475 |

FOREIGN PATENT DOCUMENTS 60-132416 7/1985 Japan .
2-168721 6/1990 Japan .

OTHER PUBLICATIONS

"A 5-ns 1-Mb ECL BiCMOS SRAM", by M. Takada et al., IEEE Journal of Solid-State Circuits, vol. 25, No. 5, Oct. 1990, pp. 1057-1062.

Primary Examiner—Edward P. Westin
Assistant Examiner—Benjamin D. Drisoll
Attorney, Agent, or Firm—Lowe, Price, LeBlanc & Becker

[57] ABSTRACT

A level converting circuit has a function of converting an input signal of a first logic level into an output signal of a second logic level. The level converting circuit includes a first transistor responsive to an input signal IN for charging an output node to the ground potential, a second transistor responsive to the input signal IN for lowering the potential of the output node to the negative potential VEE, a third transistor responsive to the potential of the output node for controlling operations of the second transistor, and fourth and fifth transistors responsive to a delay signal with delay to an output of the level converting circuit for controlling the amount of current flowing through the output node. An inverted, amplified signal of the output node is applied to the gate of the fourth transistor, and a non-inverted, amplified signal of the output node is applied to the gate of the fifth transistor. The fourth and the fifth transistors serve to enhance the potential change of the output node by the delay signal (amplified signal). As a result, a level converting circuit carrying out a switching operation at a high speed in response to the input signal IN can be implemented.

25 Claims, 9 Drawing Sheets

LEVEL CONVERTER WITH DELAY CIRCUITRY USED TO INCREASE SWITCHING SPEED

BACKGROUND OF THE INVENTION

1. Field of the Invention

The present invention generally relates to level converting circuits for converting a logic level of an input signal to a logic level of a different type, and more particularly, to a level converting circuit used in an interface portion of a semiconductor integrated circuit fabricated with a BiCMOS technology.

2. Description of the Background Art

In order to obtain a semiconductor integrated circuit operable at a high speed with low current consumption, a composite integration technology for integrating a bipolar transistor operating at a high speed and a MOSFET (an insulating gate type field effect transistor) having low current consumption on the same semiconductor chip has been conventionally developed. The composite integration technology is referred to as a BiCMOS technology.

When manufacturing a semiconductor integrated circuit having an ECL (Emitter Coupled Logic) interface by using the BiCMOS technology, a bipolar circuit (a circuit having a bipolar transistor as its component) is used as an input/output circuit for external interfacing, and a CMOS circuit (a circuit having a p channel MOS transistor and an n channel MOS transistor as its components) is used as an internal circuit for carrying out desired function When a semiconductor integrated circuit to be manufactured is a memory device, for example, it includes a circuit such as an address buffer and the like as an input/output circuit, and memory cells and a peripheral circuit such as a decoder and the like as an internal circuit.

An ECL level has its high level and low level normally set to $-0.9$ V and $-1.7$ V (or $-2.1$ V), respectively. A signal at the ECL level can be transmitted at a high speed because the small logic amplitude. Therefore, in a system which requires a high speed operation, the signal at the ECL level is used as a signal transmitted between devices.

A CMOS level has a high level substantially equal to one power supply potential VCC and a low level substantially equal to the other power supply potential VEE. The large logic amplitude therebetween makes it possible to reduce power consumption by reliably setting MOSFET to be non-conductive and cutting off a path through which a current flows. Normally, VCC is set to 0 V, and VEE is set to $-4.9$ V or $-5.2$ V. The ECL level and the CMOS level are different in the potential level and the logic amplitude. In order to achieve matching of an external signal and an internal signal, level converting function for converting a signal of one logic level into a signal of the other logic level is required in a semiconductor integrated circuit having the ECL interface.

FIG. 9 is a diagram showing a configuration of a conventional cross coupled type level converting circuit for converting an input signal of the ECL level into a signal of the CMOS level. Referring to FIG. 9, a level converting circuit 204 includes a p channel MOS transistor 202 having the gate for receiving an input signal IN of the ECL level applied to an input node N0, the source connected to a first power supply line 9 for transmitting one power supply potential VCC, and a drain connected to an output node N1, a p channel MOS transistor 200 having the gate for receiving a reference voltage (a reference potential), and the source connected to the input node N0, and cross-coupled n channel MOS transistors 201 and 203 for latching a signal potential appearing at the output node N1.

The n channel MOS transistor 201 has its gate connected to the output node N1, the drain connected to the drain of the transistor 200, and its source connected to a second power supply line 10 for transmitting the other power supply potential VEE. The n channel MOS transistor 203 has its gate connected to the drain of the transistor 201, its drain connected to the output node N1, and its source connected to the other power supply line 10.

A reference voltage REF provides a reference for determining high and low levels of the input signal IN, which is normally set to a potential of $-2$ V to $-3$ V.

The sizes of the transistors 201 and 203 are made to be slightly smaller than those of the transistors 200, 202. The transistors 201 and 203 may have appropriate current driving capability so as to change the latch state thereof in response to the potential of the input signal IN. Output load driving capability of the level converting circuit 204 is made to be small. This is because it is necessary to make load capacitance associated with the input node N0 small, thereby changing the input signal IN at a high speed. A driver circuit 205 is connected to the output node N1 of the level converting circuit 204. The driver circuit 205 buffers (or inverts and amplifies) an output signal of an MOS level (or the CMOS level) appearing at the output node N1, generates an output signal OUT, and drives a large load at the next stage. Operations will now be described.

An operation when the input signal IN makes transition from the ECL low level ($-1.7$ or $-2.1$ V) to the ECL high level ($-0.9$ V) will be first described. When the input signal IN is at the ECL low level, the transistor 202 is conductive, and charges the output node N1 to one power supply potential VCC. A CMOS (or MOS) high level signal of the output node N1 is latched by a latch circuit configured by the transistors 201 and 203. At this time, the transistor 201 is conductive, while the transistor 203 is non-conductive. The transistor 200 is brought to be conductive when the difference between the gate potential (reference potential) and the source potential (the input signal IN) becomes smaller than a threshold voltage Vtp. Therefore, in this state, the transistor 200 is brought to be substantially non-conductive. The transistor 201 is conductive since it receives a signal of the CMOS level at its gate, and the potential of the drain of the transistor 201 is brought to be the other power supply potential VEE level.

When the input signal IN rises to the ECL high level in this state, the transistor 202 makes transition to the non-conductive state. The transistor 200 makes transition to the conductive state with rise of the source potential, causing the drain potential of the transistor 200 to rise. As a result, the transistor 203 initiates transition to the conductive state, causing the potential of the output node N1 to drop. Responsively, the transistor 201 initiates transition to a non-conductive state. With the transition to the conductive state of the transistor 203 and the transition to the non-conductive state of the transistor 201, the latch state of the latch circuit configured of the transistors 201 and 203 is inverted, and the potential of the output node N1 attains the other power supply potential VEE level of the CMOS low level.

An operation when the input signal IN falls to the ECL low level will now be described. In this case, the transistor 202 makes transition to the conductive state, and initiates charging of the output node N1. With the potential rise of the output node N1, the transistor 201 initiates transition to the conductive state, and the transistor 200 is substantially non-conductive, and therefore the drain potential of transistor 200 begins to drop by the transistor 201, and then transistor 203 makes transition to the non-conductive state. With respective changes in states of the transistors 201 and 203, the latch state of the latch circuit configured of the transistors 201 and 203 changes. As a result, the potential of the output node N1 attains the CMOS high level of one power supply potential VCC level.

The signal appearing at the output node N1 is buffered by the driver circuit 205 to produce an output signal OUT of the CMOS level, driving a load of the next stage.

FIG. 10 is a diagram showing a configuration of a conventional current mirror type level converting circuit for converting the ECL level into the CMOS level. Referring to FIG. 10, a level converting circuit 214 includes a p channel MOS transistor 212 responsive to the input signal IN applied to the input node N0 for charging the output node N1 to one power supply potential (hereinafter referred to simply as a ground potential) VCC level applied to the first power supply line 9, a p channel MOS transistor 210 receiving the reference voltage REF at its gate for detecting the level of the input signal IN applied to the input node N0, an n channel MOS transistor 211 connected between the drain of the transistor 210 and the second power supply line 10, and an n channel MOS transistor 213 provided between the output node N1 and the second power supply line 10. The transistor 211 has its drain connected to each gate of the transistors 211 and 213.

The transistors 211 and 213 configure a current mirror circuit. Operations will now be described.

Description will first be given of an operation when the input signal IN rises from the ECL low level to the ECL high level. When the input signal IN is at the ECL low level, the transistor 212 is conductive, while the transistor 210 is substantially non-conductive. Since little current flows through the transistors 211 and 213 in this state, the output node N1 is at the CMOS high level of the ground potential VCC. The potential of the output node N1 is transmitted to a circuit of the next stage as the output signal OUT through a driver circuit 215. As a result, a large load of the next stage is driven at a high speed.

When the input signal IN rises from the ECL low level to the ECL high level, the transistor 212 makes transition to the non-conductive state, while the transistor 210 makes transition to the conductive state. As a result, a current flows through the transistor 211, and a mirror current is produced also in the transistor 213 accordingly. The potential of the output node N1 is discharged to a negative potential VEE (the other power supply potential is referred to as a negative potential hereinafter) at a high speed, causing the potential of the output node N1 to attain the CMOS low level.

When the input signal IN falls from the ECL high level to the ECL low level, the transistor 212 begins to be conductive, while the transistor 210 begins to be non-conductive. Since the mirror current by the transistor 213 is not produced, the output node N1 attains the CMOS high level through the transistor 212.

FIG. 11 is a diagram showing a configuration of a conventional complementary data input/output current mirror type level converting circuit for converting the ECL level into the CMOS level. A level converting circuit 300 shown in FIG. 11 includes a level converting circuit 31 responsive to ECL level input signals a, /a complementary to each other for providing a complementary output signal /b of the CMOS level, and a level converting circuit 302 responsive to the input signals a, /a for providing an output signal b of the CMOS level. The output signal /b and the output signal b are signals of the CMOS level complementary to each other.

The level converting circuit 301 includes a p channel MOS transistor 220 responsive to the input signal /a applied to an input node N10 for supplying a current from a ground line 9 to a node N15, a p channel MOS transistor 222 responsive to the input signal a applied to an input node N11 for supplying a current from the ground line 9 to an output node N12, an n channel MOS transistor 221 provided between the node N15 and a negative potential line 10, and an n channel MOS transistor 223 provided between the node N12 and the negative potential line 10.

The transistors 221 and 223 configure a current mirror circuit, and amount of supply current flow thereof is determined by the potential of the node N15.

The level converting circuit 302 having the same configuration as that of the level converting circuit 301 includes a p channel MOS transistor 224 for receiving the signal a applied to the input node N11 at its gate, a p channel MOS transistor 226 for receiving the input signal /a applied to the node N10 at its gate, and n channel MOS transistors 225 and 227 configuring a current mirror circuit. The transistor 224 charges a node N16 from the ground line 9 in response to the input signal a applied to the input node N11, and the transistor 226 charges an output node N13 from the ground line 9 in response to the input signal /a applied to the input node N10.

The complementary output signal /b and the output signal b are provided from the output node N12 and the output node N13, respectively. Operations of the level converting circuits 301 and 302 are similar to that of the level converting circuit 214 shown in FIG. 10, and therefore, operations of only one level converting circuit 301 will be described briefly.

When the input signal a changes to the ECL high level, and the input signal /a changes to the ECL low level, the transistor 222 makes transition to the nonconductive state, and the transistor 220 makes transition to the conductive state. As a result, the node N15 is supplied from the ground line 9 with a current, which in turn flows to the negative potential line 10 through the transistor 221. A current of the same amount as that in the transistor 221 flows through the transistor 223. Since the node N12 is not supplied with a current from the ground line 9, the signal /b provided from the output node N12 attains the CMOS low level of the negative potential VEE level.

When the input signal /a is at the ECL high level, and the input signal a is at the ECL low level, the transistor 220 becomes non-conductive and the transistor 222 becomes conductive. Since a current does not flow through the transistor 221 at this time, the transistor 223 becomes substantially non-conductive, causing no mirror current. As a result, the output node N12 is charged through the transistor 222, and the output signal /b attains the CMOS high level of the ground potential VCC level.

FIG. 12 is a diagram showing a configuration of a conventional complementary data input/output cross coupled type level converting circuit for converting the ECL level into the CMOS level. Referring to FIG. 12, a level converting circuit 310 includes a p channel MOS transistor 230 responsive to the input signal /a of the ECL level applied to an input node N21 for charging an output node N23 to the ground potential VCC, a p channel MOS transistor 233 responsive to the input signal a of the ECL level applied to an input node N22 for charging an output node N24 to the ground potential VCC level, and n channel MOS transistors 231, 232, 234 and 235 activated in response to the input signals /a and a applied to the input nodes N21 and N22 for configuring a cross coupled type latch circuit for latching the potentials of the output nodes N23 and N24.

The n channel MOS transistor 231 has its gate connected to the input node N21, its drain connected to the output node N23 and its source connected to a node N26. The transistor 232 has its gate connected to the output node N24, its drain connected to the node N26, and its source connected to the negative potential line 10. The transistor 234 has its gate connected to the input node N22, its drain connected to the output node N24, and its source connected to a node N25. The transistor 235 has its gate connected to the output node N23, its drain connected to the node N25, and its source connected to the negative potential line 10. Operations will now be described.

Description will be given first of an operation when the input signal a rises from the ECL low level to the ECL high level. When the input signal a is at the ECL low level, the output signals b and /b are at the CMOS low level and the CMOS high level, respectively. In this state, the transistor 235 is non-conductive, and the transistor 232 is conductive, while the transistor 231 is conductive, and the transistor 234 is non-conductive.

When the input signal a rises from the ECL low level to the ECL high level, the transistor 233 makes transition to the non-conductive state, while the transistor 230 makes transition to the conductive state. As a result, the node N23 is charged to the ground line 9 through the transistor 230, causing the potential to increase. The transistor 235 begins to make transition to the conductive state, and the transistor 234 is rendered conductive by the input signal a, causing the potential of the node N24 to decrease. The transistor 231 is non-conductive, and accordingly, the transistor 232 initiates transition to the non-conductive state. As a result, a latch circuit configured of the transistors 231, 232, 234 and 235 carries out a latch operation, causing the potentials of the nodes N23 and N24 to change, and the output signals b and /b attain the CMOS high level and the CMOS low level, respectively.

When the input signal a changes from the ECL high level to the ECL low level, the transistors 233 and 230 are rendered conductive and non-conductive, respectively, while the transistors 231 and 234 make transition to the conductive state and the non-conductive state, respectively. As a result, the potentials of the nodes N23 and N24 begin to change in accordance with transition of the input signal a from the high level to the low level, the change is latched by the latch circuit configured of the transistors 231, 232, 234 and 235, and the output signals b and /b attain the CMOS low level and the CMOS high level, respectively.

As described above, the conventional level converting circuits both of a cross coupled type and a current mirror type carry out charging and discharging of the output nodes at the CMOS level in accordance with input signals of the ECL level, thereby carrying out conversion of a signal of the ECL level into a signal of the CMOS level.

The level converting circuits shown in FIGS. 11 and 12 may be provided at the succeeding stage with a driver circuit or a buffer circuit, which in turn is configured to buffer the complementary output signals b and /b to drive a load of the succeeding stage.

The conventional level converting circuits shown in FIGS. 9 and 10 use the reference voltage (reference potential) for determining the potential level of the input signal. The reference voltage is internally generated or externally applied. The transistor for receiving the reference voltage at its gate is rendered conductive or non-conductive in accordance with the difference between the potential level of the input signal and the reference voltage. Therefore, when the reference voltage varies, the latch circuit (in the case of the cross coupled type level converting circuit) and the current mirror circuit (in the case of the current mirror type level converting circuit) are not able to carry out operations in accordance with the potential level of the input signal, so that output signals corresponding to the input signals cannot be provided.

In the cross coupled type level converting circuit, when the sizes of the transistors configuring the latch circuit become inappropriate in value because of variation of manufacturing process parameters (processing temperature, misalignment of mask and the like), the latch state of the latch circuit does not change in response to the input signal, so that output signals corresponding to the input signals cannot be provided.

When the sizes of the transistors of the latch circuit become somewhat inappropriate in value, even although the latch state can be inverted, the switching speed of the latch state may become slower, hindering a level converting circuit from operating at a high speed.

When the size of the transistor receiving the reference voltage and that of the transistors configuring the latch circuit become inappropriate in value, even if the transistor receiving the reference voltage is rendered conductive/non-conductive in accordance with input signals, the latch state of the latch circuit does not change, hindering implementation of precise level converting function. This goes for a transistor for charging an output node which receives an input signal.

In the case of the current mirror type level converting circuit, although the transistor receiving the reference voltage (reference potential) at its gate is rendered conductive/non-conductive in response to the potential level of the input signal, the transistor is not rendered non-conductive completely even if the input signal is at the ECL low level. In other words, even if the input signal is at the ECL low level, the potential difference between the gate and the source of the transistor is in the vicinity of the threshold voltage. Since one of the transistors configuring the current mirror circuit has the gate and the drain connected to each other and operates as a diode, a current path is formed so that current may flow through the current mirror circuit. Therefore, a problem is caused that the power consumption in the level converting circuit becomes larger.

SUMMARY OF THE INVENTION

An object of the present invention is to provide a level converting circuit reliably operating at a high speed with low power consumption.

Briefly, the present invention includes a controller for adjusting the amount of the current flow of charge/discharge of an output node by using a delay signal of an output signal.

When the state of the input signal changes, the state of the delayed output signal has not changed yet. The controller adjusts the amount of the current flow of the output node with the delayed output. Therefore, by using the controller, it is possible to set the amount of the current flow of the output node so as to enhancing the change of the output signal, thereby providing a level converting circuit which can carry out level conversion at a high speed.

Since the output of the level converting circuit is delayed, the delayed output is a signal having a logic level after level conversion. Therefore, the current path to be cut off in the level converting circuit is reliably brought to the cut off state by the controller, resulting in reduction of the current consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
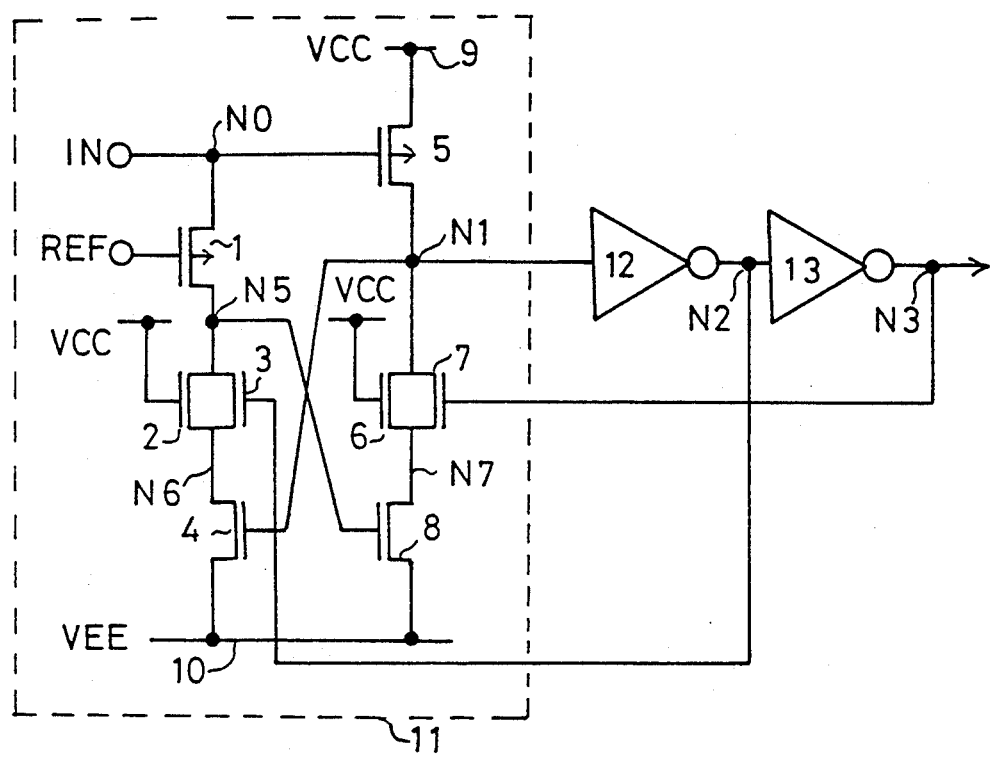
FIG. 1 is a diagram showing a configuration of a level converting circuit of a first embodiment of the present invention.

FIG. 1 is a diagram showing a configuration of a cross coupled type level converting circuit according to a first embodiment of the present invention. Referring to FIG. 1, a level converting circuit 11 converts the input signal IN of the ECL level applied to the input node N0 into a signal of the CMOS (or MOS) level to provide the same as an output signal. Since the load driving capability of the level converting circuit 11 is small, two-staged inverting amplifiers 12 and 13 are provided for receiving a signal at the output node N1. The inverting amplifiers 12 and 13 each invert applied signals as well as provide a predetermined delay time to respective output signals. The output signals of the inverting amplifiers 12 and 13 are fed back to the level converting circuit 11 in order to adjust a current flowing through a current path in the level converting circuit 11.

The level converting circuit 11 includes a p channel MOS transistor 1 having its gate connected to receive the reference voltage REF, its source connected to the input node N0, and its drain connected to a node N5, an n channel MOS transistor 2 having a gate connected to receive the ground potential VCC, one conduction terminal connected to the node N5, and the other conduction terminal connected to a node N6, an n channel MOS transistor 3 having one conduction terminal connected to the node N5, the other conduction terminal connected to the node N6, and a gate connected to receive an output of the inverting amplifier 12, and an n channel MOS transistor 4 having a drain connected to the node N6, a source connected to the negative potential line 10, and a gate connected to the output node N1. The transistor 2 and the transistor 3 are connected in parallel with each other. The transistor 2 is normally conductive, and connects the node N5 to the node N6, thereby preventing the node N6 from becoming an electrically floating state.

The level converting circuit 11 further includes a p channel MOS transistor 5 having its gate connected to receive the input signal IN applied to the input node N0, its source connected to the ground line 9, and its drain connected to the output node N1, an n channel MOS transistor 6 having one conduction terminal thereof connected to the output node N1, the other conduction terminal thereof connected to a node N7, and its gate connected to the ground potential Vcc, an n channel MOS transistor 7 having one conduction terminal connected to the output node N1, the other conduction terminal connected to the node N7, and a gate connected to receive an output of the inverting amplifier 13, and an n channel MOS transistor 8 having its drain connected to the node N7, its source connected to the negative potential line 10, and its gate connected to the node N5. The transistor 6 is provided for preventing the node N7 from entering the floating state with an unstable potential, when the transistor 7 is non-conductive.

Figure 2:
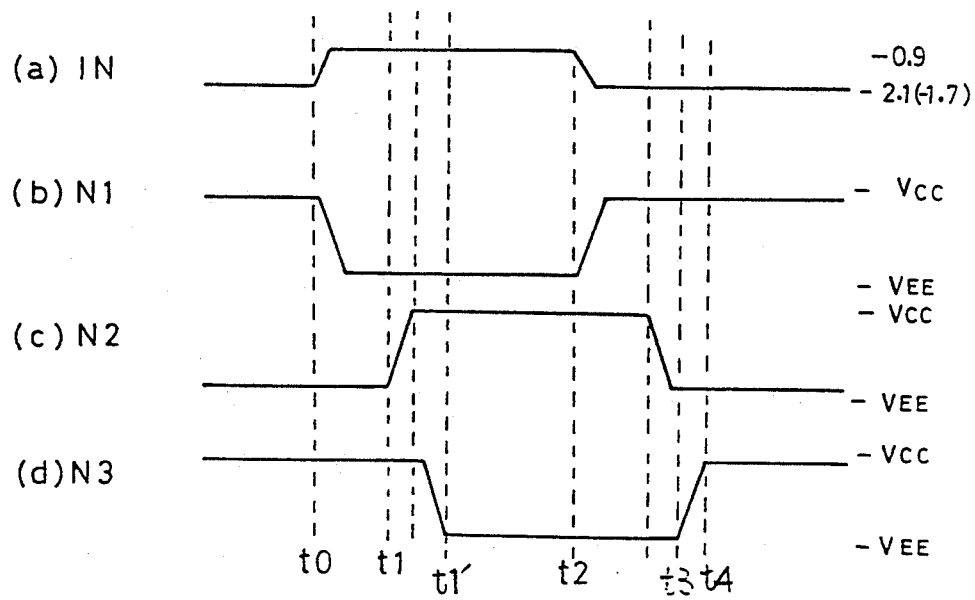
FIG. 2 is a diagram signal waveform showing operations of the level converting circuit shown in FIG. 1.

The transistors 2, 4, 6 and 8 configure a cross coupled type latch circuit, and the transistors 3 and 7 are used as a controller for controlling the amount of a current flowing through the output node N1. Operations of the level converting circuit shown in FIG. 1 will now be described with reference to a diagram of operating waveforms shown in FIG. 2.

Description will be given first of operations when the input signal IN rises from the ECL low level to the ECL high level. Prior to time t0, the input signal IN is at the ECL low level, while the output node N1 is at the CMOS high level. At this time, the potential of the output node N2 of the inverting amplifier 12 is at the CMOS (or MOS) low level, while the potential of the output node N3 of the inverting amplifier 13 is at the CMOS (or MOS) high level.

In this state, the transistors 3 and 7 are non-conductive and conductive, respectively. The transistor 4 is conductive, while the transistor 8 is non-conductive. The gate potentials of the transistors 2, 3, 4, 6, 7 and 8 are at the CMOS level. Therefore, in this state, a current does not flow through the portion of the cross coupled type latch circuit.

At time t0, the input signal IN rises from the ECL low level to the ECL high level. In response to this, charging of the output node N1 by the transistor 5 is inhibited. Also in response to this, the transistor 1 is rendered conductive, charging the node N5. As a result, the transistor 8 begins to make transition to the conductive state. In this state, the potentials of the output nodes N2 and N3 of the inverting amplifiers 12 and 13 do not change and are still at the CMOS low level and the CMOS high level, respectively. Therefore, the transistors 3 and 7 are non-conductive and conductive, respectively, when the input signal IN changes. The potential of the node N5 increases rapidly through the transistor 1.

As a result, in response to transition of the transistor 8 to the conductive state, the charge potential of the output node N1 is pulled down to the negative potential on the line 10 at a high speed, causing the potential of the output node N1 to fall to the negative potential VEE at a high speed. The potential of the output node N1 is latched by the transistors 4 and 8. The levels of the output signals of the inverting amplifiers 12 and 13 will correspond to the potential of the output node N1 of the level converting circuit 11 after time t1 a predetermined time after rise of the input signal IN rises to the ECL high level. In other words, the transistor 7 becomes non-conductive, while the transistor 3 becomes conductive at time t1.

Description will now be given of operations of transition of the input signal IN from the ECL high level to the ECL low level. At this time, the potential of the node N1 rises at time t2. In this case, the transistor 3 is conductive by the output signal of the inverting amplifier 12. When the output node N1 begins to be charged to the ground potential VCC through the transistor 5, the transistor 4 begins to make transition to the conductive state, causing the potential of the node N5 to fall through the transistors 3 and 4 at a high speed. As a result, the transistor 8 begins to be rendered non-conductive at a high speed. Since the transistor 7 is in the non-conductive state when the output node N1 is charged through the transistor 5, the potential of the output node N1 rises to the ground potential VCC at a high speed.

In this state, eventually the transistor 4 becomes conductive, the transistor 8 becomes non-conductive, and the potential of the output node N1 is latched by the latch circuit.

After a predetermined time, at times t3 and t4 output signals of the inverting amplifiers 12 and 13 attain the CMOS low level and the CMOS high level, respectively, while the transistors 3 and 7 becomes non-conductive and conductive, respectively.

As described above, by taking advantage of the delay time required by the inverting amplifiers 12 and 13 for their inverting operations, the feed-back and apply of these inverted amplified signals to the level converting circuit 11 makes it possible to carry out level conversion at a high speed. More specifically, when the potential of the output node N1 rises, the rising speed thereof is improved, and when the potential of the output node N1 falls, the output node potential is discharged to the negative potential by a feed-back signal at a high speed.

It should be noted that the delay time of the inverting amplifier 12 may be made larger, and the delay time of the inverting amplifier 13 may be made smaller, or that the delay times of both inverting amplifiers 12 and 3 may be the same.

Figure 3:
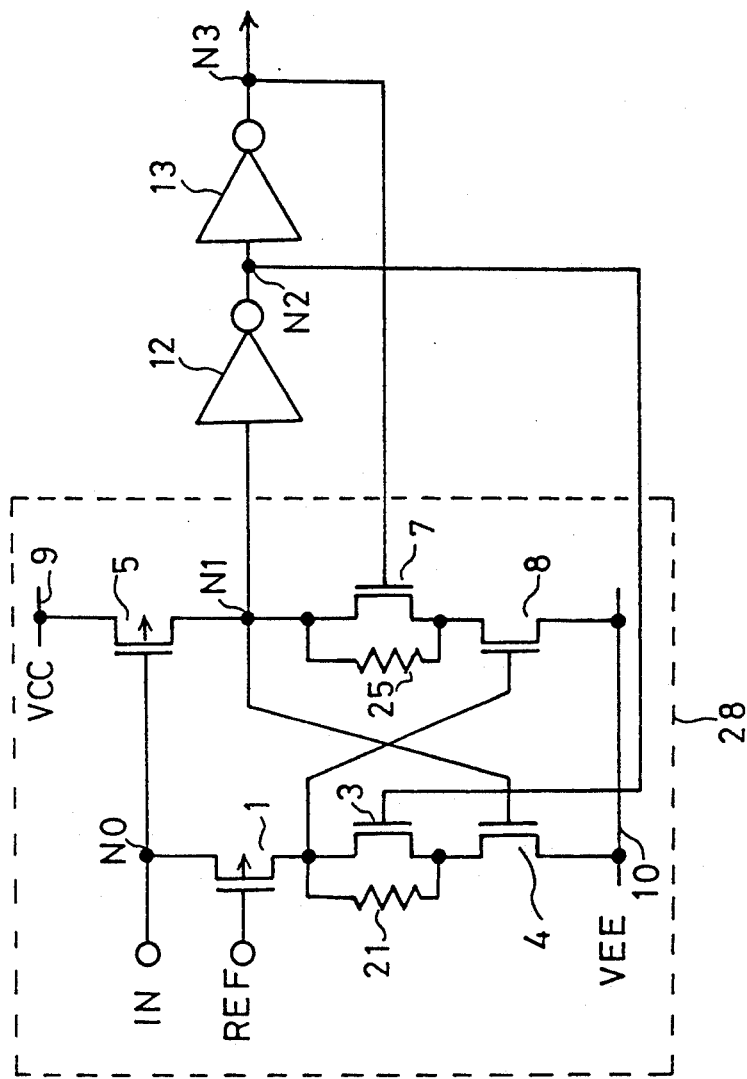
FIG. 3 is a diagram showing a configuration of a level converting circuit of a second embodiment of the present invention.

FIG. 3 is a diagram showing a configuration of a level converting circuit according to a second embodiment of the present invention. The level converting circuit shown in FIG. 3 has a configuration in which the transistors 2 and 6 of the level converting circuit shown in FIG. 1 are replaced with resistors 21 and 25, respectively. In the configuration shown in FIG. 3, resistance values of the resistors 21 and 25 are made slightly larger than respective on-resistances of the transistors 3 and 7. In other words, the resistance values of the resistors 21 and 25 are substantially made equal to the on-resistances of the transistors 2 and 6 shown in FIG. 1. As a result, the resistors 21 and 25 provides the same function as that of transistors 2 and 6.

In the configuration shown in FIG. 3, transistors 2 and 6 (cf. FIG. 1) are simply replaced with the resistors 21 and 25. The amount of current flowing through the output node N1 of a level converting circuit 28 is controlled by the feedback signals from the inverting amplifiers 12 and 13 provided in the output portion. The switching speed of the level converting circuit 28 is similarly improved.

Figure 4:
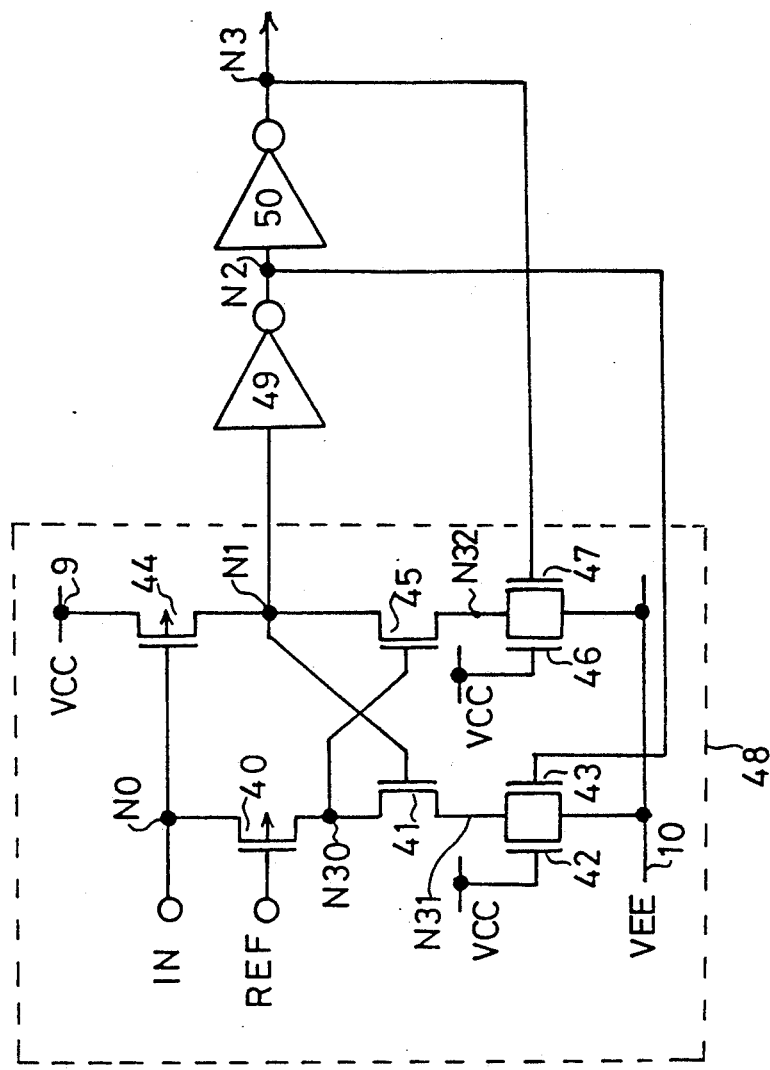
FIG. 4 is a diagram showing a configuration of a level converting circuit of a third embodiment of the present invention.

FIG. 4 is a diagram showing a configuration of a level converting circuit according to a third embodiment of the present invention. In the configuration shown in FIG. 4, a current control circuit is provided between a latch circuit (configured of transistors 41 and 45) and the negative potential line 10 for adjusting by the feed-back signal the amount of current flowing through the output node N1.

More specifically, a level converting circuit 48 shown in FIG. 4 includes a p channel MOS transistor 44 responsive to the input signal IN applied to the input node N0 for charging the output node N1 to the ground potential VCC, a p channel MOS transistor 40 having its gate connected to receive the reference voltage REF for charging the potential of a node N30 in response to the input signal IN, n channel MOS transistors 41 and 45 for latching the potential of the output node N1, and n channel MOS transistors 42, 43, 46 and 47 for controlling the amount of current flowing through the output nodes N1 and N30 by the feed-back signals from inverting amplifiers 49 and 50.

The transistors 41 and 45 have the drains and gates cross coupled to configure a cross coupled type latch circuit. The transistor 42 has one conduction terminal connected to a node N31, the other conduction terminal connected to the negative potential line 10, and a gate connected to receive the ground potential VCC. The transistor 43 has a gate connected to receive an output of the inverting amplifier 49, one conduction terminal connected to the node N31, and the other conduction terminal connected to the negative potential line 10.

The transistor 46 has a gate connected to receive the ground potential VCC, one conduction terminal thereof connected to the node N32, and the other conduction terminal connected to the negative potential line 10. The transistor 47 has a gate connected to receive an output of the inverting amplifier 50, one conduction terminal connected to the node N32, and the other conduction terminal connected to the negative potential line 10.

The output of inverting amplifier 49 is connected to the input of inverting amplifier 50, and they amplify a signal applied to the output node N1 of the level converting circuit 48. Operations will now be described briefly.

The inverting amplifiers 49 and 50 have respective delay times. The output of the inverting amplifier 49 is applied to the gate of the transistor 43, while the output of the inverting amplifier 50 is applied to the gate of the transistor 47. When the input signal IN rises from the ECL low level to the ECL high level, the potential of the node N30 increases and the transistor 45 begins to make a transition to the conductive state. In this state, the outputs of the inverting amplifiers 49 and 50 are still at the CMOS low level and the CMOS high level, respectively, and the transistor 43 is non-conductive while the transistor 47 is conductive. As a result, the potential of the output node N1 is decreased to the negative potential VEE at a high speed through the transistors 45, 47 and 46.

With the decrease of the potential of the output node N1, the transistor 41 begins to be turned off. The state is latched by the latch circuit configured of the transistors 41 and 45, thereby causing the potential of the output node N1 to attain the low level of the CMOS level.

After a predetermined time after rise of the input signal IN to the ECL high level, the outputs of the inverting amplifiers 49 and 50 attain the CMOS high level and the CMOS low level, respectively, and the transistors 43 and 47 are rendered conductive and non-conductive, respectively.

When the input signal IN falls from the ECL high level to the ECL low level, the transistor 47 is non-conductive, causing the output node N1 to be charged at a high speed by the transistor 44. As a result, the transistor 41 begins to make transition to the conductive state. The transistor 43 is still conductive. As a result, the potential of the node N30 falls at a high speed, and the transistor 45 makes the transition to the non-conductive state. Because of the state change of the transistors 41 and 45, the latch state of the latch circuit configured of the transistors 41 and 45 changes, causing the potential level of the output node N1 to attain the CMOS high level.

As described above, by controlling the amount of current flowing through the current path of the cross coupled type latch circuit by the output of an inverting amplifier as delay means provided in the output portion, a level converting circuit can be obtained which carries out a switching operation at a high speed similarly to the level converting circuits shown in FIGS. 1 and 3.

Figure 5:
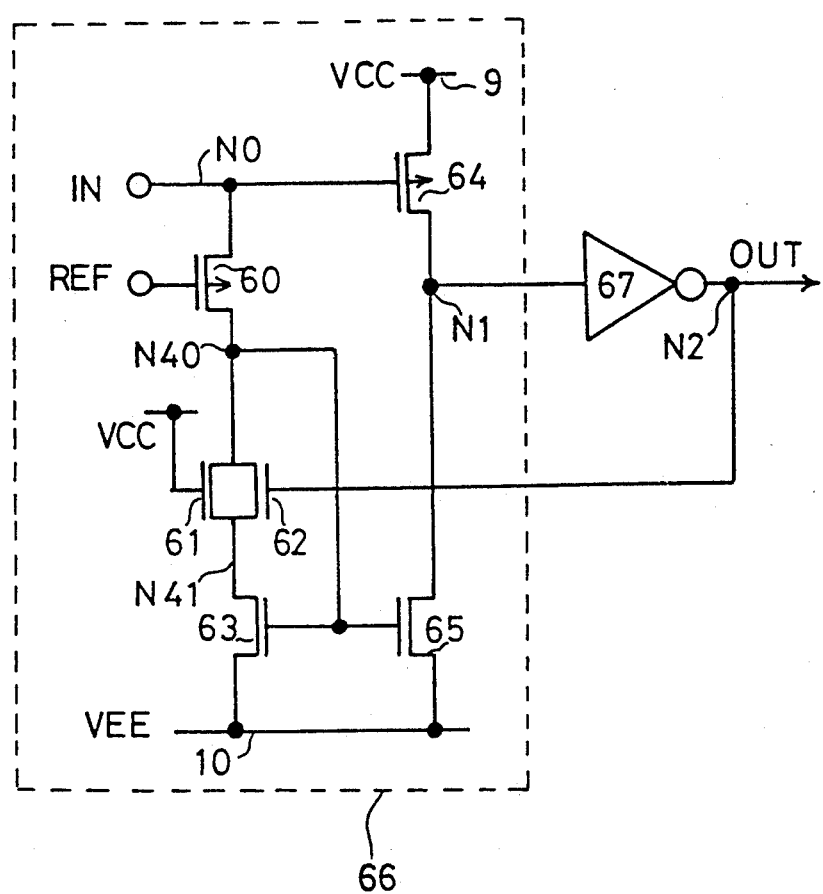
FIG. 5 is a diagram showing a configuration of a level converting circuit of a fourth embodiment of the present invention.

FIG. 5 is a diagram showing a configuration of a level converting circuit according to a fourth embodiment of the present invention. The level converting circuit shown in FIG. 5 is a current mirror type level converting circuit. A level converting circuit 66 includes a p channel MOS transistor 64 responsive to the input signal IN applied to the input node N0 for charging the output node N1 to the ground potential VCC, a p channel MOS transistor 60 responsive to the reference voltage REF and the input signal IN for determining the potential of a node N40, an n channel MOS transistor 61 for electrically connecting the node N40 and a node N41, an n channel MOS transistor 62 responsive to an output signal of an inverting amplifier 67 for controlling the amount of a current flowing between the node N40 and the node N41, an n channel MOS transistor 63 provided between the node N41 and the negative potential line 10, and an n channel MOS transistor 65 provided between the output node N1 and the negative potential line 10. The gates of the transistors 63 and 65 are connected to the node N40. As a result, transistors 65 and 63 form a current mirror circuit. Operations will now be described.

The inverting amplifier 67 inverts and amplifies the signal potential of the output node N1 of the level converting circuit 66 to provide the same as an output. Since a delay time exists at the inverting amplifier 67, a signal appearing at the node N2 has a certain delay time relative to a signal of the node N1.

When the input signal IN is at the ECL high level, the transistor 64 is non-conductive, and the transistor 60 is conductive. In this state, the transistors 63 and 65 are conductive, and the signal potential of the output node N1 is at the CMOS low level. At this time, the output signal of the inverting amplifier 67 is at the CMOS high level, and the transistor 62 is conductive.

In this state, when the input signal IN makes transition to the ECL low level, the transistor 62 causes the potential of the node N40 to fall at a high speed and the transistors 63 and 65 to make a transition to the non-conductive state, since the transistor 62 is conductive by the output of the inverting amplifier 67.

Since the output node N1 is charged to the ground potential VCC through the transistor 64, the potential of the output node N1 attains the CMOS high level. The signal of the output node N1 is fed back to the gate of the transistor 62 through the inverting amplifier 67, and the transistor 62 makes the transition to the non-conductive state.

When the input signal IN makes transition to the ECL high level, the potential of the node N40 increases, and the transistor 64 makes the transition to the non-conductive state. Since the transistor 62 is non-conductive at this time, the potential of the node N40 rises to the high level at a high speed, and the transistors 63 and 65 make transition to the conductive state. As a result, the potential of the output node N1 is discharged to the negative potential VEE through the transistor 65, and the potential of the output node N1 attains the CMOS low level.

By controlling conduction/non-conduction of the transistor 62 by the output of the inverting amplifier 67, the amount of current flowing from the node N40 to the node N41 is adjusted. In other words, by forming a discharge path only of the transistor 61 when the input signal IN rises to the ECL high level, and by discharging the node N40 by both transistors 61 and 62 when the input signal IN falls to the ECL low level, it is possible to set a mirror current flow through the transistor 65 in the direction where the potential change of the output signal obtained at the node N1 is accelerated, whereby a level converting circuit carrying out a switching operation at a high speed can be obtained. At this time, the transistor 62 can be set to the full non-conductive state by a signal of the CMOS level. When the potential of the node N40 is at the low level, the transistor 62 is completely non-conductive and the amount of current flowing through the current mirror circuit can be significantly reduced.

Figure 6:
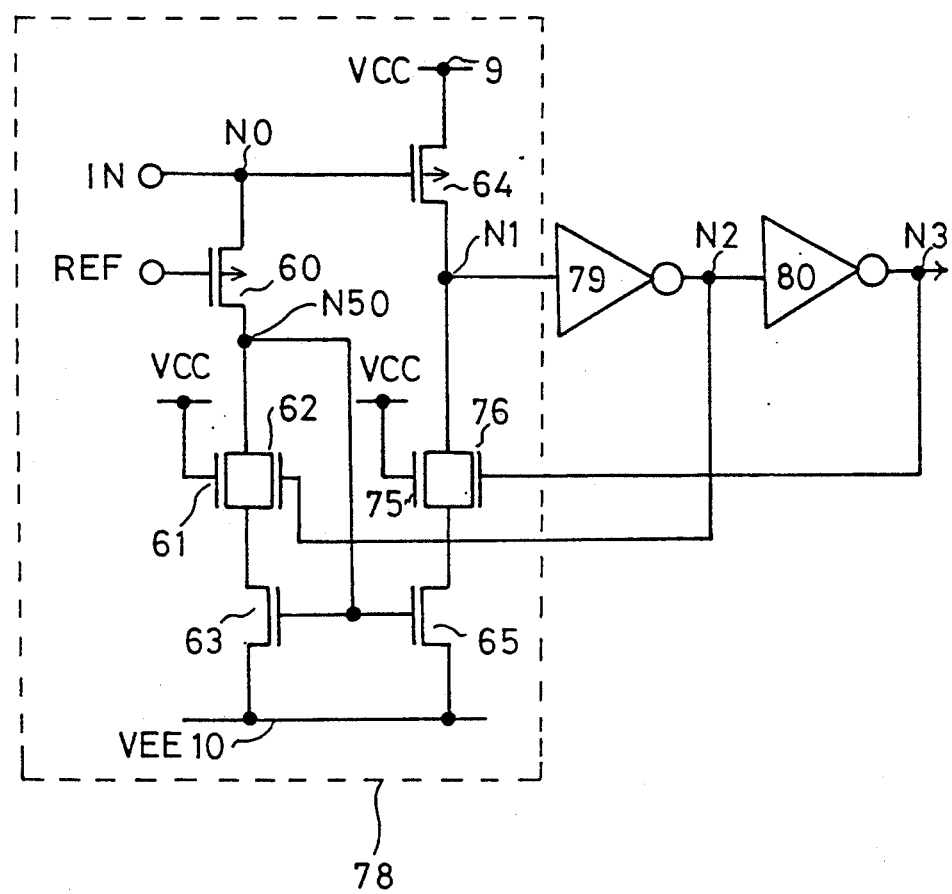
FIG. 6 is a diagram showing a configuration of a level converting circuit of a fifth embodiment of the present invention.

FIG. 6 is a diagram showing a configuration of a level converting circuit according to a fifth embodiment of the present invention. The level converting circuit shown in FIG. 6 has a configuration of the level converting circuit shown in FIG. 5 and further includes current controlling transistors 75 and 76 provided between the output node N1 and the transistor 65 configuring a part of the current mirror circuit. The transistor 75 has a gate connected to the ground potential VCC, one terminal conduction connected to the output node N1, and the other conduction terminal connected to the drain of the transistor 65. The transistor 76 has a gate connected to receive an output of an inverting amplifier 80, one conduction terminal connected to the output node N1, and the other conduction terminal connected to the drain of the transistor 65. An output signal of an inverting amplifier 79 is transmitted to the gate of the transistor 62.

There are two current controlling paths in the configuration of the level converting circuit shown in FIG. 6. In order to drive these path complementarily, the two-staged inverting amplifiers 79 and 80 are connected to an output of a level converting circuit 78. Operations thereof will now be described.

When the input signal IN is at the ECL low level, the potential of the output node N1 is at the CMOS high level. In this state, outputs of the inverting amplifiers 79 and 80 are at the CMOS low level and the CMOS high level, respectively, and the transistors 62 and 76 are non-conductive and conductive, respectively.

In this state, when the input signal IN makes transition to the ECL high level, the transistor 64 begins to be turned off, and the transistor 60 begins to be turned on. As a result, the potential of a node N50 increases and the transistors 63 and 65 begin to be turned on. At this time, since the transistor 62 is non-conductive while the transistor 76 is conductive, the potential of the node N50 rises at a high speed, and the potential of the output node N1 falls at a high speed through the transistors 76 and 65. As a result, the potential of the output node N1 attains the CMOS low level. Then, the transistor 62 is rendered to be conductive, while the transistor 70 is rendered to be non-conductive.

When the input signal IN makes transition to the ECL low level, the transistor 64 begins to be turned on, and the transistor 60 begins to be turned off. At this time, since the transistor 62 is conductive while the transistor 76 is non-conductive, the potential of the node N50 decreases at a high speed, and the transistor 65 makes transition to the non-conductive state. At this time, since the transistor 76 is already rendered non-conductive, the output node N1 is charged through the transistor 64, and the potential of the output node N1 attains the CMOS high level of the ground potential VCC level. The transistor 62 and 76 make transition to the non-conductive state and the conductive state, respectively, by outputs of the inverting amplifiers 79 and 80.

As described above, by controlling the amount of a mirror current flowing through the output node in the current mirror circuit by a delay signal delayed to the output signal which appears at the output node, it is possible to increase the potential changing speed of the signal at the output node, whereby a level converting circuit carrying out a switching operation at a high speed can be obtained.

When the input signal IN is at the ECL low level, since the transistor 62 is completely non-conductive by the output of the inverting amplifier 79, it is possible to set the current flowing through the current mirror circuit to a value which can be substantially ignored.

Figure 7:
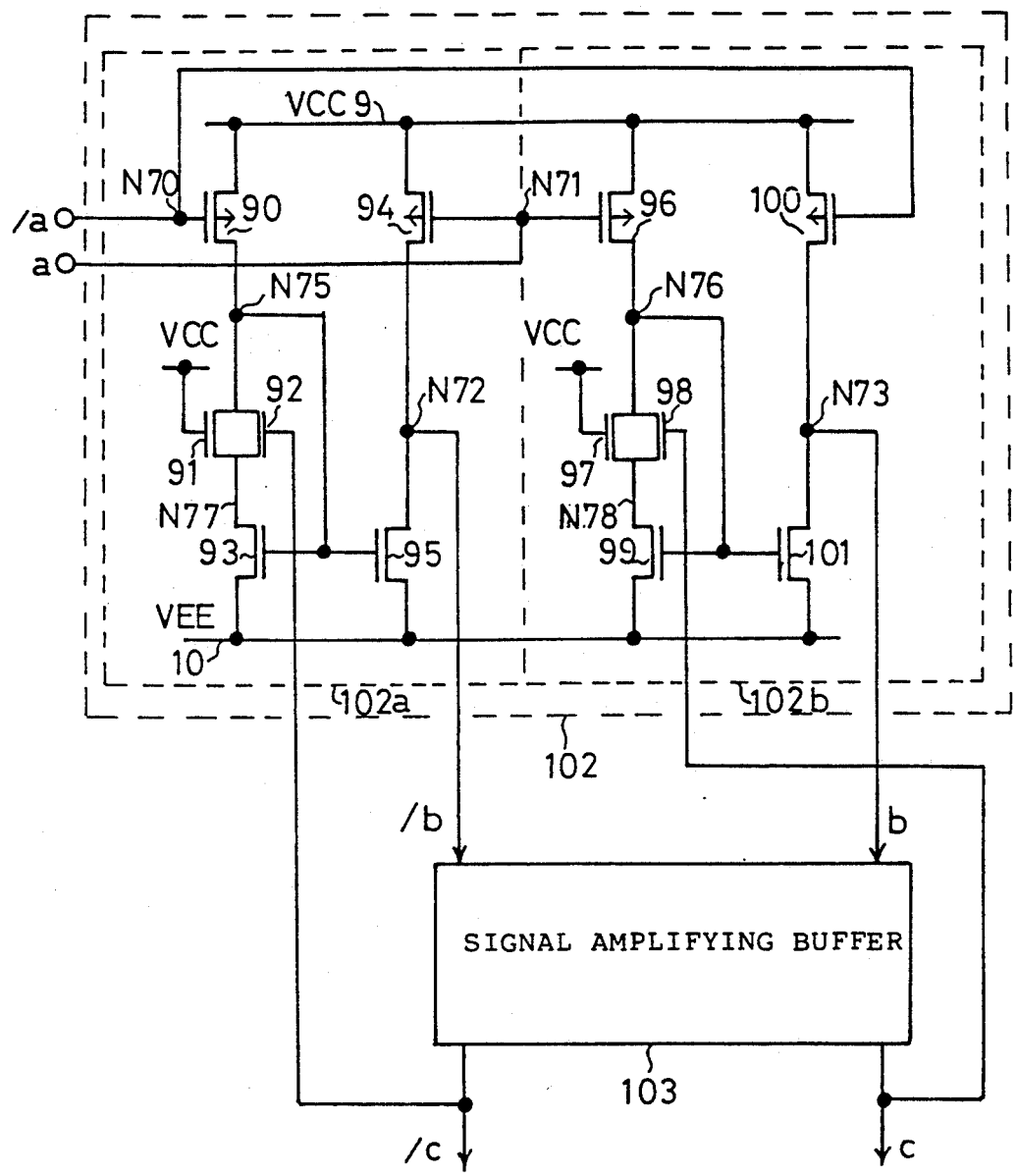
FIG. 7 is a diagram showing a configuration of a level converting circuit of a sixth embodiment of the present invention.

FIG. 7 is a diagram showing a configuration of a level converting circuit according to a sixth embodiment of the present invention. A level converting circuit 102 shown in FIG. 7 converts complementary input signals of the ECL level into complementary output signals of the CMOS level. The level converting circuit 102 includes a level converting circuit 102a for producing the output signal /b from the complementary input signals a, /a of the ECL level, and a level converting circuit 102b for producing the output signal b of the CMOS level from the complementary input signals a, /a.

The level converting circuit 102a includes p channel MOS transistors 90 and 94 responsive to input signals /a and a applied to input nodes N70 and N71 for charging input nodes N75 and N72 to the ground potential VCC, respectively, an n channel MOS transistor 92 responsive to a feedback signal /c from a signal amplifying buffer 103 provided in the output portion for controlling the amount of current flowing between the node N75 and a node N77, an n channel MOS transistor 93 connected between the node N77 and the negative potential line 10, and an n channel MOS transistor 95 connected between the output node N72 and the negative potential line 10. The gates of the transistors 93 and 95 are connected to the node N75. In parallel with the transistor 92, an n channel MOS transistor 91 having a gate connected to the ground potential VCC is provided.

The level converting circuit 102b includes p channel MOS transistors 100 and 96 responsive to the input signals a and a applied to the input nodes N70 and N71 for charging nodes N73 and N76 to the ground potential VCC, respectively, an n channel MOS transistor 98 responsive to a feed-back signal c from the signal amplifying buffer 103 for controlling the amount of current flowing between the node N76 and a node N78, an n channel MOS transistor 99 provided between the node N78 and the negative potential line 10, and an n channel MOS transistor 101 provided between the output node N73 and the negative potential line 10. The gates of the transistors 99 and 101 are connected to the node N76. In parallel with the transistor 98, an n channel MOS transistor 97 having a gate coupled to the ground potential VCC is provided.

Operations will now be described. The level converting circuits 102a and 102b are the same in operations with each other, but different only from each other in the potential level relation between the input signal and the output signal. Therefore, description will be given hereinafter only of operations of the level converting circuit 102a.

The signal amplifying buffer 103 provided at the output of the level converting circuit 102 buffers the complementary output signals b and /b from the level converting circuit 102 to drive a load of the next stage. The signal amplifying buffer 103 also has a predetermined delay time because of its buffering, and the predetermined delay time exists between the signals b, /b and the signals c, /c.

When the input signal a is at the ECL low level, and the input signal /a is at the ECL high level, the transistor 90 is non-conductive and the transistor 94 is conductive. In this state, the node N72 is charged to the ground potential VCC level through the transistor 94, and the output signal /b is at the CMOS high level. The output signal /c from the signal amplifying buffer 103 attains the CMOS high level after a predetermined time, and the transistor 92 is rendered conductive.

In this state, when the input signal a makes the transition to the ECL high level, the transistor 94 begins to be turned off, while the transistor 90 begins to be turned on. In this state, since the transistor 92 is in the conductive state, current flows from the node N75 to the negative potential line 10 through the transistors 91, 92 and 93. A mirror current corresponding to a current flowing between the node N75 and the negative potential line 10 flows through the transistor 95. As a result, the potential of the node N72 falls to the CMOS low level of the negative potential VEE level at a high speed. Then the signal /c falls to the CMOS low level, rendering the transistor 92 to be non-conductive.

When the input signal a makes transition to the ECL low level in this state, the transistor 94 begins to be turned on, while the transistor 90 begins to be turned off. Since the transistor 92 is now non-conductive, and the potential of the node N75 is at the low level by the transistor 91, the transistor 95 is non-conductive, hindering the mirror current from flowing to the output node N72. As a result, the output node N72 is charged to the ground potential VCC level through the transistor 94 at a high speed, and the output signal /b rises to the CMOS high level. After a predetermined time, the output signal /c of the signal amplifying buffer 103 rises to the CMOS high level, causing the transistor 92 to be conductive.

Also in a configuration of the level converting circuit shown in FIG. 7, it is possible to implement a level converting circuit carrying out a switching operation at a high speed, by controlling the amount of current flowing through the output node N72 by the delay signal.

Figure 8:
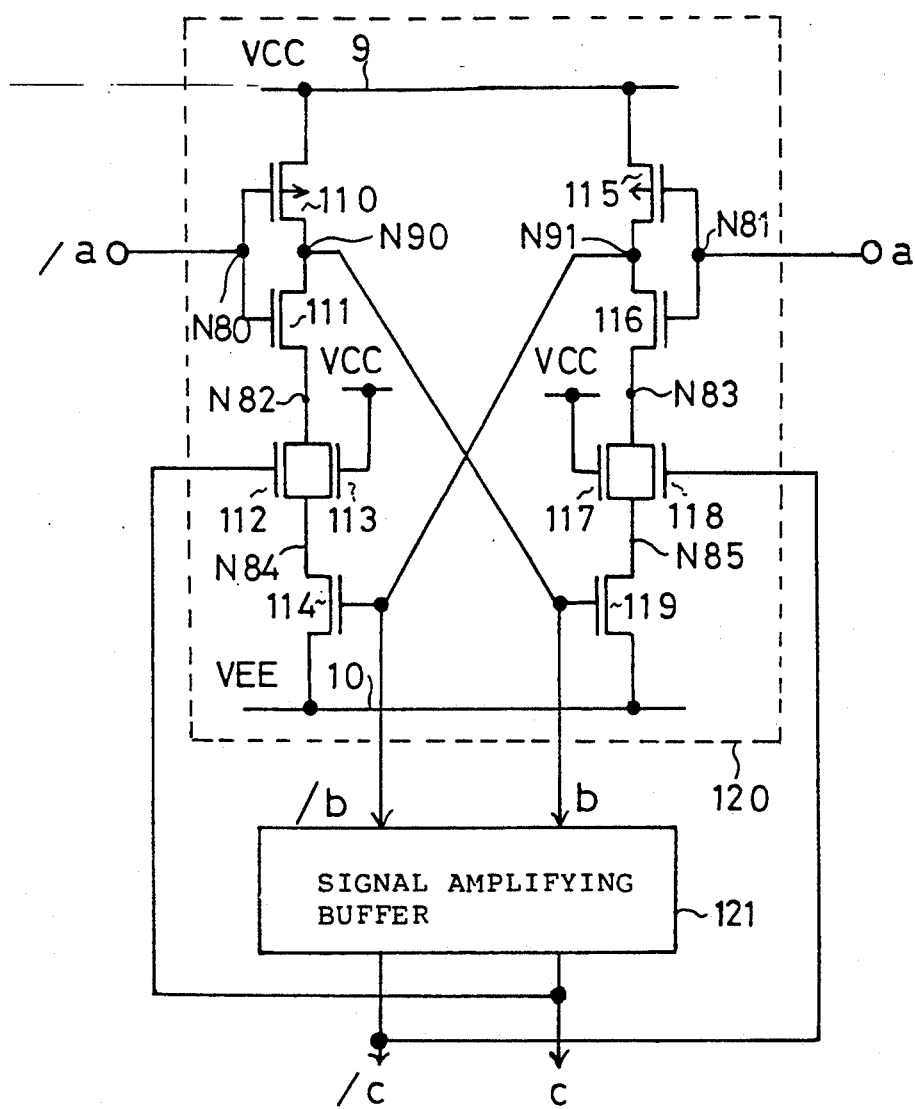
FIG. 8 is a diagram showing a configuration of a level converting circuit of a seventh embodiment of the present invention.
Figure 9:
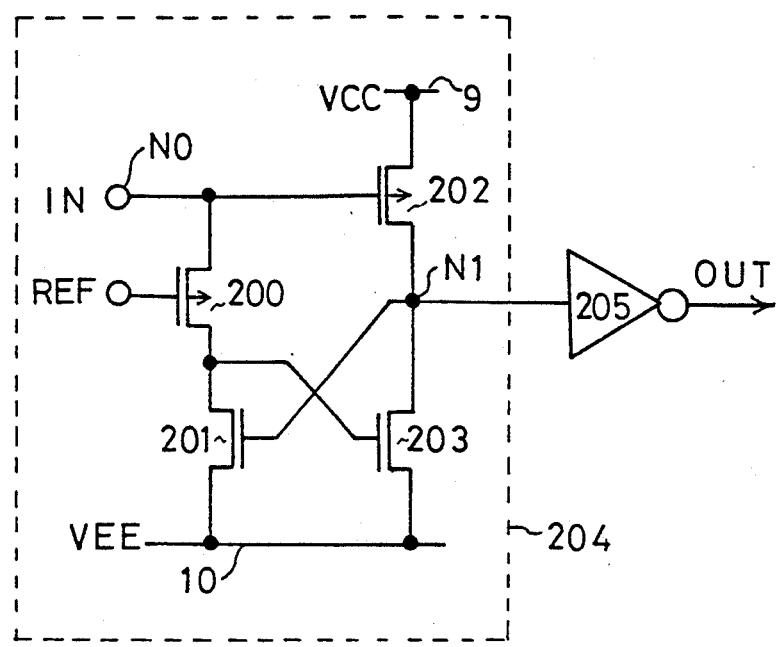
FIG. 9 is a diagram showing a configuration of a conventional cross coupled type level converting circuit.
Figure 10:
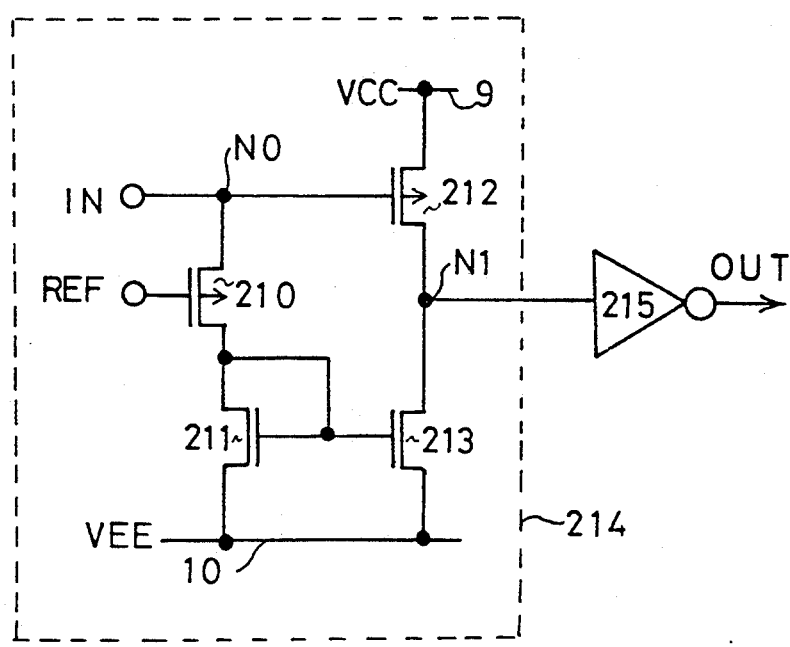
FIG. 10 is a diagram showing a configuration of a conventional current mirror type level converting circuit.
Figure 11:
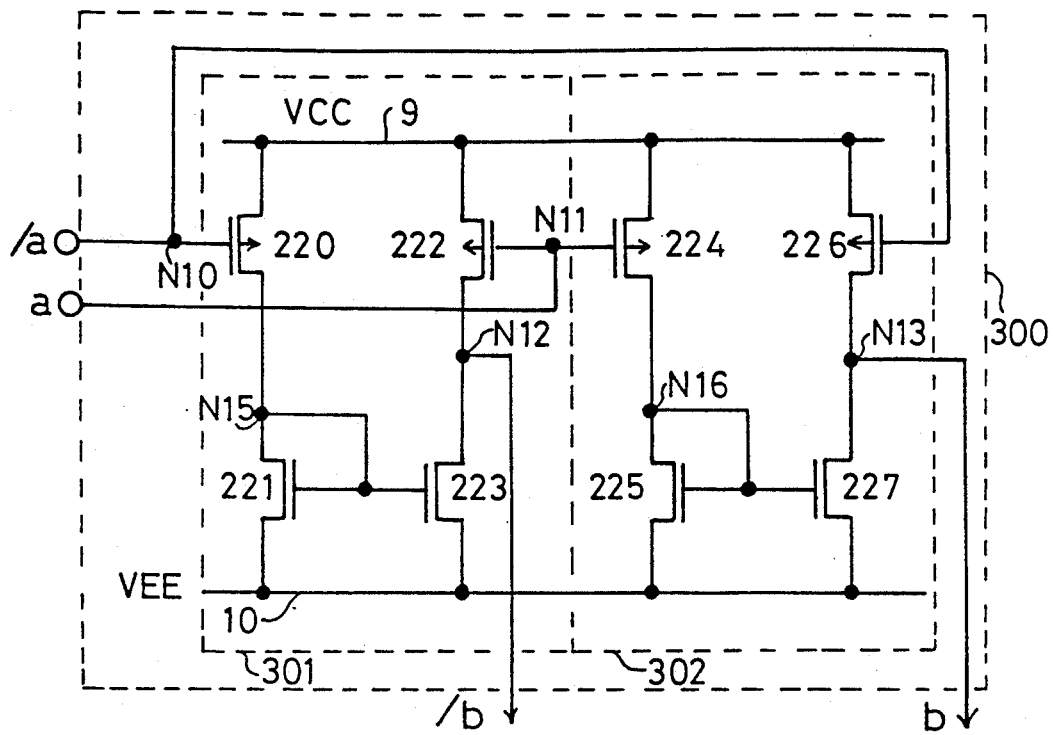
FIG. 11 is a diagram showing a configuration of a conventional complementary data input/output current mirror type level converting circuit.
Figure 12:
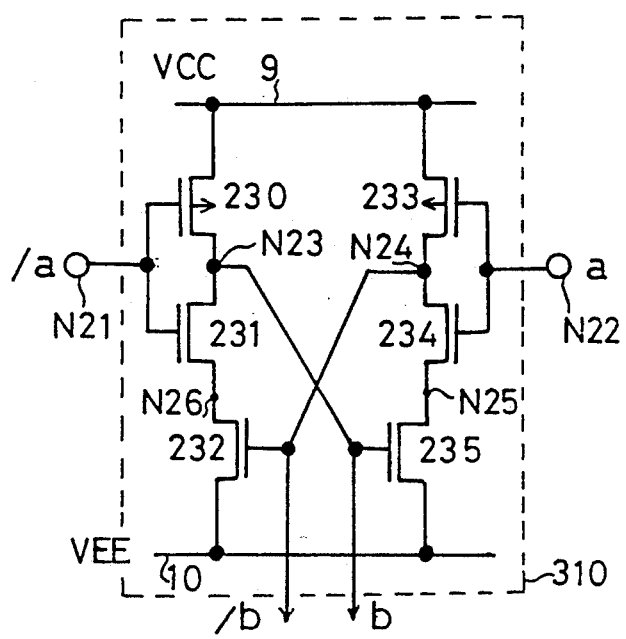
FIG. 12 is a diagram showing a configuration of a conventional complementary data input/output cross coupled type level converting circuit.

FIG. 8 is a diagram showing a configuration of a level converting circuit according to a seventh embodiment of the present invention. The level converting circuit shown in FIG. 8 is a cross coupled type level converting circuit which converts the complementary input signals a, a of the ECL level into the output signals b, /b of the CMOS level.

Referring to FIG. 8, a level converting circuit 120 includes a p channel MOS transistor 110 and an n channel MOS transistor 111 connected between the ground line 9 and a node N82, n channel MOS transistors 112, 113 connected in parallel with each other between the node N82 and a node N84, and an n channel MOS transistor 114 connected between the node N84 and the negative potential line 10. The gates of the transistors 110 and 111 are connected to the input node N80. The input signal /a of the ECL level is applied to the input node N80. The drains of the transistors 110 and 111 are connected to an output node N90. The output signal b of the CMOS level is provided from the output node N90. The transistor 113 has a gate connected to receive the ground potential VCC, and one and the other conduction terminals connected to the nodes N82 and N84, respectively. The transistor 112 has a gate connected to receive the output signal c from a signal amplifying buffer 121, and one and the other conduction terminals connected to the nodes N82 and N84, respectively. The transistor 114 has a gate connected to an output node N91, and drain and source connected to the node N84 and the negative potential line 10, respectively.

The level converting circuit 120 further includes a p channel MOS transistor 115 and an n channel MOS transistor 116 connected between the ground line 10 and the node N83, n channel MOS transistors 117 and 118 connected in parallel with each other between the node N83 and the node N85, and an n channel MOS transistor 119 connected between the node N85 and the negative potential line 10.

The gates of the transistors 115 and 116 are connected to the input node N81. The input signal a of the ECL level is applied to the input node N81. The drains of the transistors 115 and 116 are connected to the output node N91. The output signal /b of the CMOS level is provided from the output node N91.

The ground potential VCC is applied to the gate of the transistor 117, while the signal /c of the CMOS level from the signal amplifying buffer 121 is applied to the gate of the transistor 118. The gate of the transistor 119 is connected to the output node N90.

Description will now be given of the operations briefly. When the input signal a is at the ECL low level and the input signal /a is at the ECL high level, the transistor 115 is conductive, the transistor 110 is non-conductive, and the output node N90 is at the CMOS low level, while the output node N91 is at the CMOS high level. The transistor 112 is non-conductive, while the transistor 118 is conductive.

In this state, when the input signal a makes the transition to the ECL high level, the transistors 110 and 116 begins to be turned on, while the transistors 111 and 115 begin to be turned off. As a result, the transistor 119 begins to be turned on.

The transistor 112 is now non-conductive, and the transistor 118 is now conductive by the signals c, /c. As a result, the potential of the node N91 is pulled down to the negative potential VEE at a high speed, causing the transistor 114 to be turned off. The states of the nodes N90 and N91 are latched by a latch circuit (transistors 111, 112, 113, 114, 116, 117, 118 and 119) and the signal potentials of the output nodes N90 and N91 attain high and low levels of the CMOS level, respectively. After change of the output signals b, /b, the output signals c and /c from the signal amplifying buffer 121 also attain high and low levels of the CMOS level, respectively, causing the transistors 112 and 118 to be conductive and nonconductive, respectively.

When the input signal a makes the transition from the ECL high level to the ECL low level and the input signal /a makes the transition from the ECL low level to the ECL high level, the transistors 111 and 115 begin to be turned on, while the transistors 110 and 116 begin to be turned off. The transistor 112 is now conductive, the transistor 118 is now non-conductive, and the node N91 is charged at a high speed through the transistor 115. The node N90 is discharged to the negative potential VEE at a high speed through the transistors 111, 112, 113 and 114. As a result, the signals b, /b change at a high speed, the latch circuit latches the signal potential of the nodes N90 and N91, and the potentials of the node N90 and the node N91 attain low and high levels of the CMOS level, respectively. As a result, it is possible to implement a level converting circuit carrying out a switching operation at a high speed.

In the above-described embodiments, the level converting circuit converts an input signal of the ECL level into an output signal of the CMOS level. However, the present invention can be applied to a circuit converting a signal of one logic level into a signal of another logic level.

As described above, since the present invention controls the amount of current flowing through an output node by using a delay signal of a level-converted signal which appears at an output of a level converting circuit, it is possible to change the potential of the output node at a high speed, and to implement a level converting circuit operating at a high speed.

Also in a current mirror type level converting circuit, since a current path is adapted to have the amount of current flowing therethrough controlled by a delay signal, it is possible to reliably cut off the current path, and to implement a level converting circuit with low current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level converter for converting an input signal of a first logic type level received at an input node into an output signal of a second logic type level, comprising:
   an output node for supplying the output signal;
   first means responsive to said input signal for setting said output node at a level of a first potential;
   second means responsive to said input signal for setting said output node at a level of a second potential;
   delay means for delaying a signal at said output node; and
   control means responsive to a delay signal received from said delay means, for controlling the magnitude of a resistance between said output node and said second potential,
   wherein said second means includes latch means for latching a signal potential at said output node, and wherein said control means includes means responsive to said delay signal, for changing the magnitude of a resistance between said latch means and said second potential.

2. A level converter for converting an input signal of a first logic type level received at an input node into an output signal of a second logic type level, comprising:
   an output node for supplying the output signal;
   first means responsive to said input signal for setting said output node at a level of a first potential;
   second means responsive to said input signal for setting said output node at a level of a second potential;
   delay means for delaying a signal at said output node; and
   control means responsive to a delay signal received from said delay means, for controlling the magnitude of a resistance between said output node and said second potential,
   wherein said second means includes latch means for latching a signal potential at said output node, and wherein said control means includes means responsive to said delay signal, for changing the magnitude of a resistance between said output node and said latch means.

3. A level converter for converting an input signal of a first logic type level received at an input node into an output signal of a second logic type level, comprising:
   an output node for supplying the output signal;
   first means responsive to said input signal for setting said output node at a level of a first potential;
   second means responsive to said input signal for setting said output node at a level of a second potential;
   delay means for delaying a signal at said output node; and
   control means responsive to a delay signal received from said delay means, for controlling the magnitude of a resistance between said output node and said second potential,
   wherein said second means includes:
   a first field effect transistor provided between said input node and a first node having a gate receiving a predetermined reference potential,
   a second field effect transistor having one conduction terminal coupled to receive said second potential and a gate connected to said output node,
   a third field effect transistor having one conduction terminal coupled to receive said second potential and a gate connected to said first node, and
   wherein said delay means includes:
   a first buffer for inverting and amplifying a signal at said output node, and a second buffer for inverting and amplifying an output signal of said first buffer,
   and wherein said control means includes:
   a fourth field effect transistor provided between said first node and said second field effect transistor and having a gate receiving the output signal of said first buffer, and
   a fifth field effect transistor provided between said output node and said third field effect transistor and having a gate receiving an output signal of said second buffer.

4. A level converter according to claim 3, wherein said control means further includes:
   a first resistance means provided between said first node and said second field effect transistor and having a resistance substantially the same as an on-resistance of said fourth field effect transistor, and a second resistance means provided between said output node and said third field effect transistor having a resistance substantially the same as an on-resistance said fifth field effect transistor.

5. A level converter according to claim 4, wherein said first resistance means includes a field effect transistor connected in parallel with said fourth field effect transistor and having a gate connected to receive said first potential.

6. A level converter according to claim 4, wherein said second resistance means includes a field effect transistor connected in parallel with said fifth field effect transistor and having a gate connected to receive said second potential.

7. A level converter for converting an input signal of a first logic type level received at an input node into an output signal of a second logic type level, comprising:
   an output node for supplying the output signal;
   first means responsive to said input signal for setting said output node at a level of a first potential;
   second means responsive to said input signal for setting said output node at a level of a second potential;
   delay means for delaying a signal at said output node; and
   control means responsive to a delay signal received from said delay means, for controlling the magnitude of a resistance between said output node and said second potential, wherein said second means includes:

a first field effect transistor having one conduction terminal connected to said input node, another conduction terminal connected to a first node, and a gate connected to receive a predetermined potential, a second field effect transistor having one conduction terminal connected to said first node, another conduction terminal connected to a second node, and a gate connected to said output node, and a third field effect transistor having one conduction terminal connected to said output node, another conduction terminal connected to a third node, and wherein said delay means includes:

a first buffer for inverting and amplifying a signal at said output node, and a second buffer for inverting and amplifying an output of said first buffer, and wherein said control means includes:

a fourth field effect transistor having one conduction terminal connected to said second node, another conduction terminal connected to receive said second potential, and a gate connected to receive the output of said first buffer, and a fifth field effect transistor having one conduction terminal connected to said third node, another conduction terminal connected to receive said second potential, and a gate connected to receive an output of said second buffer.

8. A level converter according to claim 7, wherein said control means further includes a first resistance means connected in parallel with said fourth field effect transistor and having a resistance substantially the same as an on-resistance of said fourth field effect transistor, and a second resistance means connected in parallel with said fifth field effect transistor and having a resistance substantially the same as an on-resistance said fifth field effect transistor.

9. A level converter according to claim 8, wherein said first resistance means comprises a field effect transistor having one conduction terminal connected to said second node, a gate connected to receive said first potential and another conduction terminal connected to receive said second potential.

10. A level converter according to claim 8, wherein said second resistance means comprises a field effect transistor having one conduction terminal connected to said output node, a gate connected to receive said first potential, and another conduction terminal connected to receive said second potential.

11. A level converter for converting an input signal of a first logic type level received at an input node into an output signal of a second logic type level, comprising:

an output node for supplying the output signal;

first means responsive to said input signal for setting said output node at a level of a first potential;

second means responsive to said input signal for setting said output node at a level of a second potential;

delay means for delaying a signal at said output node; and control means responsive to a delay signal received from said delay means, for controlling the magnitude of a resistance between said output node and said second potential, wherein said second means includes a first current path between said input node and a node supplying said second potential, for providing a current flow responsive to said input signal, and a current path between said output node and the node supplying said second potential in a current mirror configuration with said first current path, and wherein said control means includes:

means responsive to the delay signal for changing a resistance value of at least one of said first and second current paths.

12. A level converter according to claim 11, wherein said delay means comprises a first buffer for inverting and amplifying a signal at said output node, and wherein said first current path includes a first field effect transistor having one conduction terminal connected to said input node, another conduction terminal connected to a first node, and a gate connected to receive a predetermined reference potential, a second field effect transistor having one conduction terminal connected to receive said second potential, another conduction terminal connected to a second node, and a gate connected to said first node for determining an amount of current flow through said second current path, and wherein said control means includes a field effect transistor having one conduction terminal connected to said first node, and another conduction terminal connected to said second node, and a gate connected to receive an output of said first buffer.

13. A level converter according to claim 12, wherein said control means further includes a resistance means connected between said first and second nodes and having a large resistance.

14. A level converter according to claim 13, wherein said resistance means comprises a field effect transistor having one conduction terminal connected to said first node, a gate connected to receive said first potential, and another conduction terminal connected to said second node.

15. A level converter according to claim 12, wherein said delay means further includes a second buffer for inverting and amplifying an output of said first buffer, and wherein said second current path includes a third field effect transistor having one conduction terminal connected to receive said second potential, a gate connected to said first node, and another conduction terminal connected to a third node, and wherein said control means further includes a fourth field effect transistor having one conduction terminal connected to said output node, another conduction terminal connected to said third node, and a gate connected to receive an output of said second buffer.

16. A level converter according to claim 15, wherein said control means further includes a resistance means connected between said third node and said output node in parallel with said fourth field effect transistor and having a resistance substantially the same as an on-resistance of said fourth field effect transistor.

17. A level converter according to claim 16, wherein said resistance means comprises a field effect transistor having one conduction terminal connected to said output node, a gate connected to receive said first potential, and another conduction terminal connected to said third node.

18. A level converter for converting an input signal of a first logic type level received at an input node into an output signal of a second logic type level, comprising:
an output node for supplying the output signal;
first means responsive to said input signal for setting said output node at a level of a first potential;
second means responsive to said input signal for setting said output node at a level of a second potential;
delay means for delaying a signal at said output node; and
control means responsive to a delay signal received from said delay means, for controlling the magnitude of a resistance between said output node and said second potential,
wherein said second means includes:
a first field effect transistor responsive to an input signal complementary to the input signal applied to said first means for charging a first node at a level of the first potential,
a second field effect transistor having one conduction terminal connected to a second node, a gate connected to said first node, and another conduction terminal connected to receive a second potential, and
a third field effect transistor having one conduction terminal connected to said output node, a gate connected to said first node, and another conduction terminal connected to receive said second potential, and
wherein said delay means includes:
a first buffer for buffering a signal at said output node, and
wherein said control means includes:
a fourth field effect transistor having one conduction terminal connected to said first node, another conduction terminal connected to said second node, and a gate connected to receive an output of said buffer means.

19. A level converter according to claim 18, wherein said control means further includes a resistance means connected between said first and second nodes in parallel with said fourth field effect transistor and having a resistance substantially the same as an on-resistance of said fourth field effect transistor.

20. A level converter for converting an input signal of a first logic type level received at an input node into an output signal of a second logic type level, comprising:
an output node for supplying the output signal;
first means responsive to said input signal for setting said output node at a level of a first potential;
second means responsive to said input signal for setting said output node at a level of a second potential;
delay means for delaying a signal at said output node; and
control means responsive to a delay signal received from said delay means, for controlling the magnitude of a resistance between said output node and said second potential,
wherein said first means includes:
a first field effect transistor responsive to a signal received at a first input node for charging a first output node to the first potential, and
a second field effect transistor responsive to a signal received at a second input node for charging a second output node to the first potential, the signal at the first input node being complementary to the signal at the second input node, and
wherein said second means includes:
a third field effect transistor responsive to the signal at the second input node for charging a first node to the first potential,
a fourth field effect transistor having one conduction terminal connected to a second node, a gate connected to said first node, and another conduction terminal connected to receive a second potential,
a fifth field effect transistor having one conduction terminal connected to said first output node, a gate connected to said said first node, and another conduction terminal connected to receive the second potential,
a sixth field effect transistor responsive to the signal at the first input node for charging a third node to the first potential,
a seventh field effect transistor having one conduction terminal connected to a fourth node, a gate connected to the third node, and another conduction terminal connected to receive the second potential, and
an eighth field effect transistor having one conduction terminal connected to the second output node, a gate connected to the third node, and another conduction terminal connected to receive the second potential, and
wherein said delay means includes:
a first buffer for buffering the signal at said first output node, and
wherein said control means includes:
a ninth field effect transistor having one conduction terminal connected to said first node, a gate connected to receive an output of said first buffer, and another conduction terminal connected to the second node, and
a tenth field effect transistor having one conduction terminal connected to the third node, a gate connected to receive an output of said second buffer, and another conduction terminal connected to the fourth node.

21. A level converter according to claim 20, wherein said control means further includes
a first resistance element connected between said first said second nodes in parallel with the ninth field effect transistor, and
a second resistance element connected between said third and fourth nodes in parallel with said tenth field effect transistor.

22. A level converter according to claim 21, wherein each of said first and second resistance elements comprises a field effect transistor having a gate connected to receive a first potential, said first and second resistance elements having an on-resistance substantially the same as the on-resistance said ninth and tenth field effect transistors, respectively.

23. A level converter for converting an input signal of a first logic type level received at an input node into an output signal of a second logic type level, comprising:
an output node for supplying the output signal;
first means responsive to said input signal for setting said output node at a level of a first potential;
second means responsive to said input signal for setting said output node at a level of a second potential;
delay means for delaying a signal at said output node; and control means responsive to a delay signal received from said delay means, for controlling the magnitude of a resistance between said output node and said second potential, wherein said first means includes:

a first field effect transistor responsive to a signal received at a first output node, for charging a first output node to a level of the first potential, and a second field effect transistor responsive to a signal at a second input node, for charging a second output node to a level of the first potential, the signal at the first input node being complementary to the signal at the second input node, and wherein said second means includes:

a third field effect transistor having one conduction terminal connected to the first output node, a gate connected to receive the signal at the first input node, and another conduction terminal connected to a first node, a fourth field effect transistor having one conduction terminal connected to a second node, a gate connected to the second output node, and another conduction terminal connected to receive a second potential, a fifth field effect transistor having one conduction terminal connected to the second output node, a gate connected to the second input node, and another conduction terminal connected to a third node, and a sixth field effect transistor having one conduction terminal connected to a fourth node, a gate connected to the first output node, and another conduction terminal connected to receive the second potential and wherein said delay means includes:

a first buffer for buffering the signal at said second output node, and a second buffer for buffering the signal at said first output node, and wherein said control means includes:

a seventh field effect transistor having one conduction terminal connected to a first node, a gate connected to receive an output of the second buffer, and another conduction terminal connected to the second node, and an eighth field effect transistor having one conduction terminal connected to the third node, a gate connected to receive an output of the first buffer, and another conduction terminal connected to the fourth node.

24. A level converter according to claim 23, wherein said control means further includes:

a first resistance element connected between said first and second nodes in parallel with the seventh field effect transistor and having a resistance substantially the same as an on-resistance of said seventh field effect transistor, and a second resistance element connected between said third and fourth nodes in parallel with the eighth field effect transistor and having a resistance substantially the same as an on-resistance of said eighth field effect transistor.

25. A level converter according to claim 24, wherein each of said first and second resistance elements comprises a field effect transistor having a gate connected to receive the first potential, said first and second resistance elements having an on-resistance substantially the same as the on-resistance of said seventh and eighth field effect transistors, respectively.

* * * * *